(12) United States Patent
Tripoli et al.

(10) Patent No.: US 12,456,950 B2
(45) Date of Patent: Oct. 28, 2025

(54) HIGHLY COUPLED INDUCTOR DESIGN FOR REDUCING AREA AND POWER CONSUMPTION OF A MULTI-CORE OSCILLATOR

(71) Applicant: STMicroelectronics International N.V., Geneva (CH)

(72) Inventors: Daniele Tripoli, Syracuse (IT); Giorgio Maiellaro, Gravina di Catania (IT); Santi Concetto Pavone, Catania (IT); Egidio Ragonese, Aci Catena (IT); Angelo Scuderi, Catania (IT)

(73) Assignee: STMicroelectronics International N.V., Geneva (CH)

( * ) Notice: Subject to any disclaimer, the term of this patent is extended or adjusted under 35 U.S.C. 154(b) by 338 days.

(21) Appl. No.: 18/068,708

(22) Filed: Dec. 20, 2022

(65) Prior Publication Data

US 2024/0204727 A1   Jun. 20, 2024

(51) Int. Cl.
*H03B 5/12*     (2006.01)
*G01S 7/03*     (2006.01)
*H01F 27/28*    (2006.01)
*H01F 27/29*    (2006.01)
*H01F 27/40*    (2006.01)
(Continued)

(52) U.S. Cl.
CPC ............ *H03B 5/1206* (2013.01); *G01S 7/032* (2013.01); *H01F 27/28* (2013.01); *H01F 27/29* (2013.01); *H01F 27/40* (2013.01); *H03B 5/08* (2013.01); *H03B 5/1212* (2013.01); *H03B 5/1243* (2013.01); *H03B 5/1253* (2013.01);
(Continued)

(58) Field of Classification Search
CPC ............ H03B 5/1206; H03B 2200/009; H03B 5/1243; H03B 5/1253; H03B 5/1852; H03B 5/1212; H03B 5/08; G01S 7/032; H03L 7/099; H01P 3/081; H01F 27/28; H01F 27/29; H01F 27/40
USPC ........... 331/2, 167, 117 FE, 117 R; 336/200; 455/260
See application file for complete search history.

(56) References Cited

U.S. PATENT DOCUMENTS

| | | | |
|---|---|---|---|
| 8,842,410 B2* | 9/2014 | Chan | ....................... H01F 21/12 307/37 |
| 10,680,552 B2* | 6/2020 | Gu | ....................... H03B 5/1206 |

(Continued)

OTHER PUBLICATIONS

Murphy et al., "A 27-GHz Quad-Core CMOS Oscillator With No Mode Ambiguity" in IEEE Journal of Solid-State Circuits, Nov. 2018.

(Continued)

*Primary Examiner* — Arnold M Kinkead
(74) *Attorney, Agent, or Firm* — Alston & Bird LLP

(57) ABSTRACT

A circuit, integrated circuit, and radar system implementing a highly coupled inductor design for a multi-core oscillator is provided. An example circuit may include a plurality of inductors, each inductor including: a first inductor portion and a second inductor portion electrically connected in series. In some embodiments, for each inductor, the first inductor portion may be magnetically coupled to a first or second inductor portion of a first coupling inductor of the plurality of inductors, and the second inductor portion may be magnetically coupled to a first or second inductor portion of a second coupling inductor of the plurality of inductors, where the first coupling inductor and the second coupling inductor are different inductors.

17 Claims, 9 Drawing Sheets

(51) Int. Cl.
  *H01P 3/08* (2006.01)
  *H03B 5/08* (2006.01)
  *H03B 5/18* (2006.01)
  *H03L 7/099* (2006.01)

(52) U.S. Cl.
  CPC ........... *H03B 5/1852* (2013.01); *H03L 7/099* (2013.01); *H01P 3/081* (2013.01); *H03B 2200/009* (2013.01)

(56) References Cited

U.S. PATENT DOCUMENTS

2014/0218120 A1   8/2014   Hekmat et al.
2019/0355511 A1   11/2019  Dekker et al.

OTHER PUBLICATIONS

Rimmelspacher et al., "A Quad-Core 60 GHz Push-Push 45 nm SOI CMOS VCO with -101.7 dBc/Hz Phase Noise at 1 MHz offset, 19 % Continuous FTR and -187 dBc/Hz FoMT", ESSCIRC, 2018.
Iotti et al., "Insights Into Phase-Noise Scaling in Switch-Coupled Multi-Core LC VCOs for E-Band Adaptive Modulation Links" in IEEE Journal of Solid-State Circuits, Jul. 2017.
EP 23214671.2 Extended European Search Report mailed May 16, 2024.

\* cited by examiner

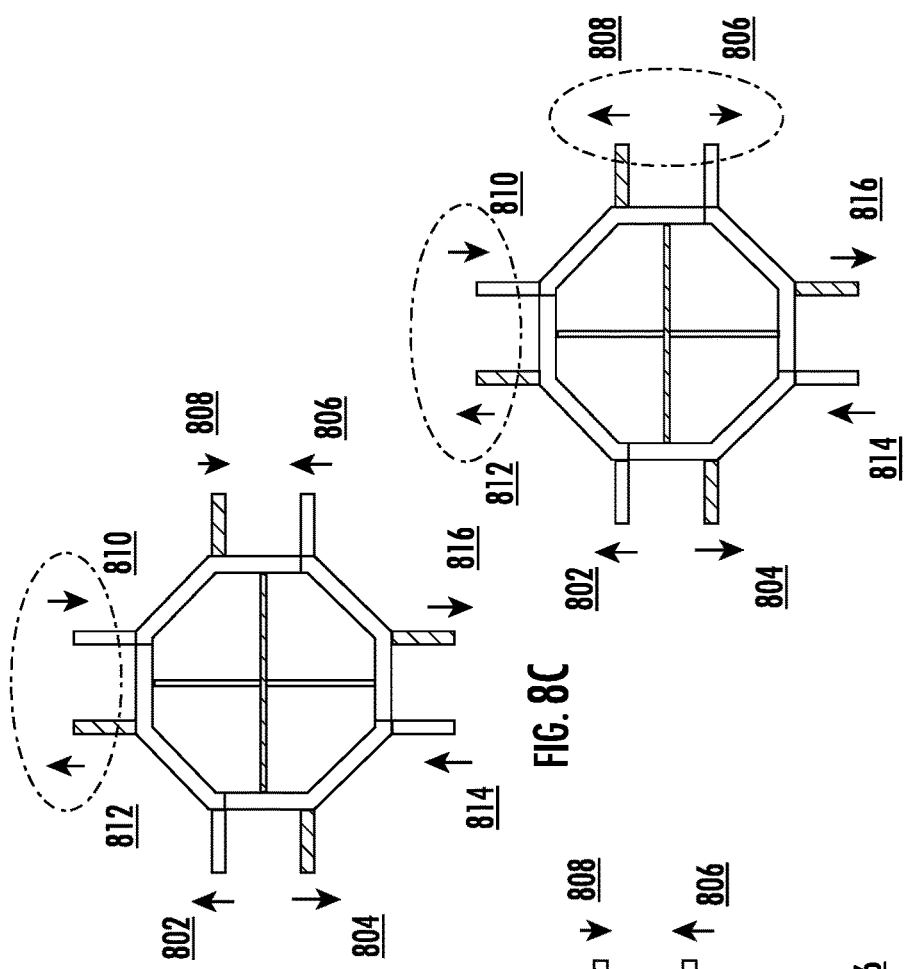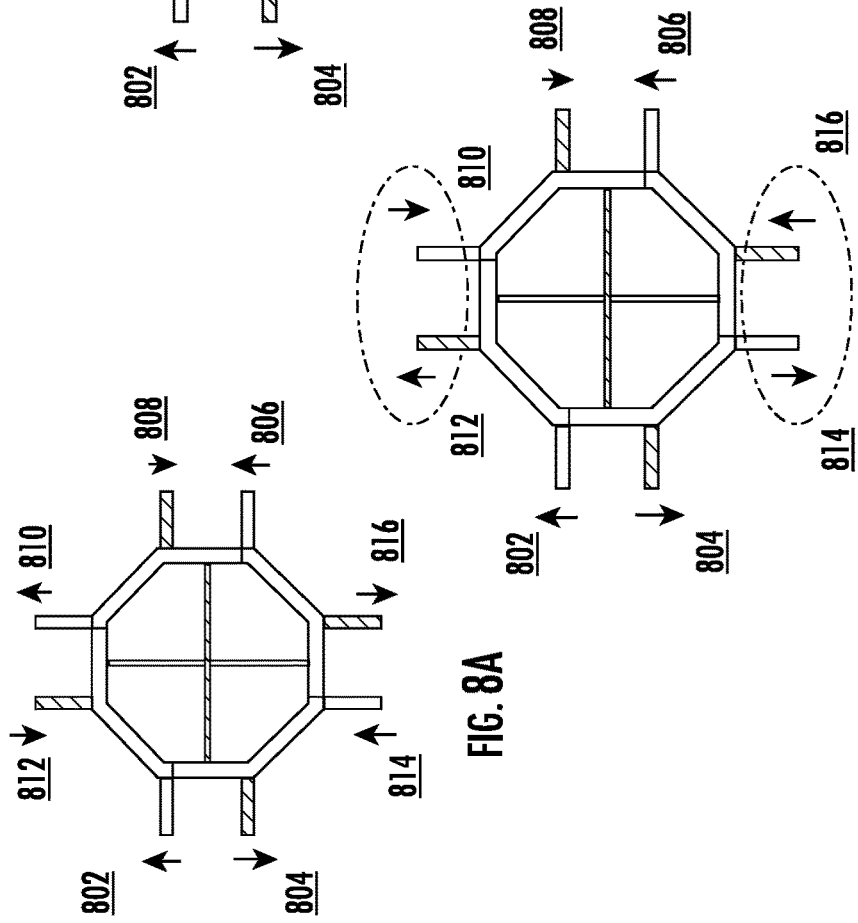

HIGHLY COUPLED INDUCTOR DESIGN FOR REDUCING AREA AND POWER CONSUMPTION OF A MULTI-CORE OSCILLATOR

TECHNOLOGICAL FIELD

Embodiments of the present disclosure relate generally to oscillating circuits, and more particularly, to oscillating circuits employing multiple oscillating cores to reduce phase noise.

BACKGROUND

Any communication system, radar, or similar device may, in some examples, utilize an oscillator, for example a voltage-controlled oscillator (VCO), to provide the fundamental synthesis functionality of the reference carrier. In one specific example, radar systems may transmit a reference carrier signal and receive the reflected signal bouncing off nearby objects. Based on the physical characteristics of the reflected signal, a radar system may determine information about the reflecting object (e.g., size, shape, distance, velocity, material, etc.). Radar systems capable of detecting and ranging objects are becoming more prevalent in automotive applications. Radar systems which adopt frequency synthesizers with low phase noise, capable of supporting higher resolutions, may improve the overall accuracy of the radar system.

Many approaches have found that coupling the outputs of multiple identical LC oscillators, or cores, enables a reduction in phase noise. However, approaches utilizing multiple LC oscillators generally occupy a significant area and have high power consumption. Occupying area on an integrated circuit may increase the manufacturing cost of an integrated circuit as well as increase the size of the implementing device. In addition, increasing the number of operating LC cores may increase the power consumption of the implementing device. Some approaches seek to decrease the area of multiple cores through techniques such as stacking. However, in some examples, stacking may result in a considerable decline in the resonator quality factor and increase in phase noise in the generated output signal.

Applicant has identified many technical challenges and difficulties associated with utilizing multiple oscillating cores to produce an oscillating signal with low phase noise. Through applied effort, ingenuity, and innovation, Applicant has solved problems related to the interaction of multiple oscillating cores by developing solutions embodied in the present disclosure, which are described in detail below.

BRIEF SUMMARY

Various embodiments are directed to an example circuit, integrated circuit, and system for implementing a multi-core oscillator utilizing highly coupled inductors in a reduced area footprint.

In accordance with some embodiments of the present disclosure, an example circuit is provided. In some embodiments, the circuit may comprise a plurality of inductors, each inductor of the plurality of inductors comprising: a first inductor portion and a second inductor portion. In some embodiments, the first inductor portion and the second inductor portion may be electrically connected in series. Further, in some embodiments, for each inductor of the plurality of inductors, the first inductor portion may be magnetically coupled to a first or second inductor portion of a first coupling inductor of the plurality of inductors, and the second inductor portion may be magnetically coupled to a first or second inductor portion of a second coupling inductor of the plurality of inductors. In addition, in some embodiments, the first coupling inductor and the second coupling inductor are different inductors.

In some embodiments, at least one of the plurality of inductors may be a multi-port inductor.

In some embodiments, at least one of the plurality of inductors may be a dual-port inductor, wherein the at least one dual-port inductor comprises a first active component and a second active component, wherein each active component comprises a first terminal and a second terminal. In addition, in some embodiments, the first conductive microstrip may electrically connect the first terminal of the first active component to the second terminal of the second active component. Further, the second conductive microstrip may electrically connect the second terminal of the first active component to the first terminal of the second active component.

In some embodiments, the at least one dual-port inductor may further comprise a resistor electrically connected between the first conductive microstrip and the second conductive microstrip.

In some embodiments, each active component may further comprise a capacitive component electrically connected to the first terminal and the second terminal.

In some embodiments, a first voltage phase at the first terminal and a second voltage phase at the second terminal may be inverse.

In some embodiments, each active component may comprise at least a cross-coupled pair of transistors.

In some embodiments, a first coupling coefficient between the first inductor portion of an inductor and the portion of the first coupling inductor may be greater than 0.1, and a second coupling coefficient between the second inductor portion of an inductor and the portion of the second coupling inductor may be greater than 0.1.

An example integrated circuit is further provided. In some embodiments, the example integrated circuit may comprise a first layer, a second layer, a first inductor comprising a first inductor conductive microstrip disposed on the first layer and the second layer, and a second inductor comprising a second inductor conductive microstrip disposed on the first layer and the second layer. In addition, the first inductor and second inductor may be disposed, such that a portion of the first inductor conductive microstrip is substantially aligned with a portion of the second inductor conductive microstrip.

In some embodiments, at least one of the first inductor and the second inductor may be a multi-port inductor.

In some embodiments, at least one of the first inductor and the second inductor may be a dual-port inductor.

In some embodiments, the first inductor and the second inductor may each be a dual-port oscillator comprising a first conductive microstrip and a second conductive microstrip. IN some embodiments, each conductive microstrip may comprise a first end that terminates at a first active component, and a second end that terminates at a second active component. Further, each conductive microstrip may comprise at least a first inductor portion disposed on the first layer and a second inductor portion disposed on the second layer. In addition, the first inductor portion and second inductor portion may be electrically connected by a connecting via.

In some embodiments, at least one first inductor portion of a conductive microstrip of the first inductor may pass across at least one second inductor portion of the second inductor.

In some embodiments, the first conductive microstrip of the first inductor and the second conductive microstrip of the first inductor may be electrically connected by a first resistive trace, and the first conductive microstrip of the second inductor and the second conductive microstrip of the second inductor may be electrically connected by a second resistive trace.

In some embodiments, each active component may comprise at least a cross-coupled pair of transistors and a capacitor.

In some embodiments, a portion of the conductive microstrip of the first inductor and a portion of the conductive microstrip of the second inductor may be magnetically coupled.

In some embodiments, a coupling coefficient between the portion of the conductive microstrip of the first inductor and the portion of the conductive microstrip of the second inductor may be greater than 0.1.

An example radar system comprising an oscillating system is further provided. In some embodiments, the oscillating system of the example radar system may comprise a plurality of inductors. Each inductor of the plurality of inductors may further comprise a first inductor portion and a second inductor portion, wherein the first inductor portion and the second inductor portion are electrically connected in series. Further, in some embodiments, for each inductor of the plurality of inductors, the first inductor portion may be magnetically coupled to a portion of a first coupling inductor of the plurality of inductors, and the second inductor portion may be magnetically coupled to a portion of a second coupling inductor of the plurality of inductors. In addition, the first coupling inductor and the second coupling inductor may be different inductors.

In some embodiments, the radar system may further comprise a voltage-controlled oscillator comprising an oscillating system and a phase-locked loop comprising the voltage-controlled oscillator. The radar system may further comprise a local oscillator electrically connected to the phase-locked loop, wherein the phase-locked loop generates an output signal based at least in part on a reference signal generated by the local oscillator. In some embodiments, the radar system may further comprise a transmit amplifier electrically connected to the phase-locked loop, wherein the transmit amplifier generates an amplified output signal based at least in part on the output signal. Further, the radar system may comprise a transmit antenna electrically connected to the transmit amplifier, wherein the transmit antenna transmits a transmitted signal based at least in part on the amplified output signal. In addition, the radar system may comprise a receive antenna configured to receive a reflected signal resulting from one or more objects encountered by the transmitted signal and a receive amplifier electrically connected to the receive antenna, wherein the receive amplifier is configured to generate an amplified receive signal based at least in part on the reflected signal. The radar system may further comprise a mixer electrically connected to the phase-locked loop and the receive amplifier, wherein the mixer is configured to produce a mixed signal based at least in part on the output signal and the amplified receive signal; a receive filter electrically connected to the mixer, wherein the receive filter is configured to generate a filtered signal based at least in part on the mixed signal; and a processor electrically connected to the receive filter, wherein the processor determines one or more characteristics of the one or more objects based at least in part on the filtered signal.

In some embodiments, at least one of the plurality of inductors may be a multi-port inductor.

In some embodiments, at least one of the plurality of inductors may be a dual-port inductor. In some embodiments, the at least one dual-port inductor may comprise a first active component and a second active component, wherein each active component comprises a first terminal and a second terminal. In some embodiments, a first conductive microstrip may electrically connect the first terminal of the first active component to the first terminal of the second active component. Further, in some embodiments, a second conductive microstrip may electrically connect the second terminal of the first active component to the second terminal of the second active component.

In some embodiments, the at least one dual-port inductor may further comprise a resistor electrically connected between the first conductive microstrip and the second conductive microstrip.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

FIG. 8A depicts an example excitation pattern at each terminal of the example dual-port inductors in accordance with an example embodiment of the present disclosure.

FIG. 8B depicts another example excitation pattern at each terminal of the example dual-port inductors in accordance with an example embodiment of the present disclosure.

FIG. 8C depicts yet another example excitation pattern at each terminal of the example dual-port inductors in accordance with an example embodiment of the present disclosure.

FIG. 8D depicts still another example excitation pattern at each terminal of the example dual-port inductors in accordance with an example embodiment of the present disclosure.

DETAILED DESCRIPTION

Figure 1:
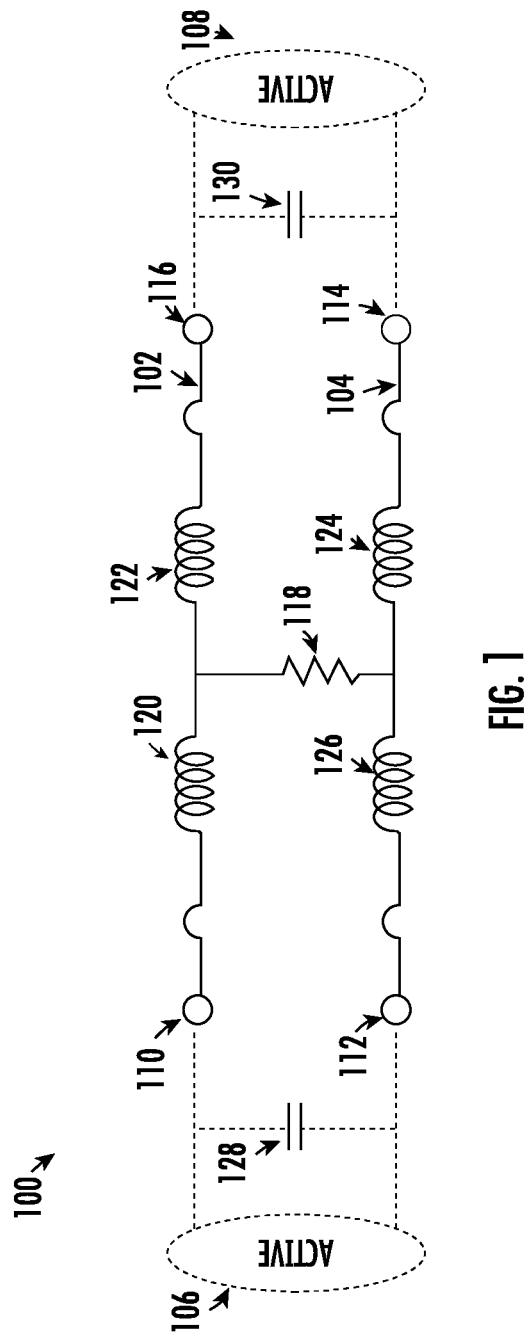
FIG. 1 illustrates a circuit diagram of an example dual-core oscillator in accordance with an example embodiment of the present disclosure.

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "behind," "top," "vertical," "horizontal," "above," "below," "over", "under", etc. are used for explanatory purposes in the examples provided below to describe the relative positions of certain components or portions of components relative to a local reference frame of an oscillating circuit using an arbitrary global reference frame.

Various example embodiments address technical problems associated with utilizing multiple oscillating cores to produce an oscillating signal with low phase noise. As understood by those of skill in the field to which the present disclosure pertains, there are numerous example scenarios in which an oscillating signal with low phase noise may be necessary, specifically, an oscillator which produces an oscillating signal with low phase noise while adhering to specific power and area confinements.

In general, any communication system, radar, or similar device may utilize, in some examples, an oscillator, for example a voltage-controlled oscillator (VCO), to provide the fundamental synthesis functionality of the reference carrier. Several types of oscillators exist, however some widely used oscillators, for example ring and relaxation oscillators, do away with the inductive component to enable the manufacture of smaller and cheaper oscillators. Radio frequency (RF) and mm-wave applications generally have stringent requirements on phase-noise performance. LC oscillators, consisting of an LC tank circuit, having an inductor and a capacitor, and an active component are generally used in such applications because of a higher quality factor of the passive components, which leads to an output signal with lower phase noise.

In one specific example, a radar system capable of detecting and determining the range of objects may utilize an LC oscillator to generate and radiate a specified signal. Based on the portions of the radiated signal reflected back to a receiver on the radar system, the radar system may determine information about the reflecting object (e.g., size, shape, distance, velocity, material, etc.). Radar systems capable of detecting and ranging objects are becoming more prevalent in automotive applications. In a typical radar system, a signal generator generates a frequency-modulated sine wave which is amplified and transmitted toward a target. Reflections of the transmitted signal are received by a receiving antenna of the radar system. A digital signal processor (DSP) may then compare the reflected signal with the reference signal and determine characteristics of an object based on the reflections. Ultra-wideband (UWB) radar systems, or systems that target both narrowband (used for long range targets) and wideband (used for short range targets) frequency targets, may be capable of being tuned across a wide range of frequencies, for example, a 5-GHz range. Radar systems supporting UWB enable a radar system to support high resolutions and improve the overall accuracy of the radar system, however, to produce these performance improvements, the radar system must generate a signal with low phase noise, for example, phase noise as low as −105 dBc/Hz at 1 MHz offset, −125 dBc/Hz at 10 MHz offset.

Many example approaches have found that coupling the outputs of multiple identical LC oscillators, or cores, enables a reduction in the phase noise. For example, phase noise may be decreased by −10·log(N) dB, where N is the number of cores in the multi-core LC oscillator. One approach that has been used is to place multiple cores in close proximity and electrically connect the active part of each of the cores to synchronize the multiple cores. L. Iotti, et al., *Insights Into Phase-Noise Scaling in Switch-Coupled Multi-Core LC VCOs for E-Band Adaptive Modulation Links*, IEEE Journal of Solid-State Circuits 1703 (July 2017). Such an approach may occupy a large area, thus increasing manufacturing costs, particularly since the inductor components of the LC tank circuits are spread apart to reduce proximity effects between the inductors and simplify the design of the single core. Moreover, the reduction of the phase noise is obtained at the cost of a significant increase of the power consumption by a factor of N, where N is the number of cores. Another approach that has been used is to stack inductors on top of one another on multiple layers of an integrated circuit. J. Rimmelspacher, et al., *A Quad-Core 60 GHz Push-Push 45 nm SOI CMOS VCO with −101.7 dBc/Hz Phase Noise at 1 MHz offset, 19% Continuous FTS and −187 dBc Hz FoMT*, ESSCIRC 2018—IEEE 44$^{th}$ European Solid State Circuits Conference 138 (2018). While stacked layers reduce the area required to implement the multiple cores, the stacked inductors may produce increased phase noise (or exhibit a low Q-factor) due at least in part to proximity effects, without significant benefits in terms of power consumption.

The various example embodiments described herein utilize various techniques to reduce the overall area occupied by an LC oscillator while generating an output signal with low phase noise. For example, in some embodiments, multiple LC oscillators may be coupled utilizing the inductive component of the LC oscillator. In addition, the LC oscillators may be divided into portions and each inductor portion may be coupled with an inductor portion of a separate LC oscillator. In some examples, multi-port LC oscillators may be utilized to improve the Q-factor of the inductor and enable the suppression of unwanted oscillation modes. D. Murphy and H. Darabi, *A 27-GHz Quad-Core CMOS Oscillator With No Mode Ambiguity*, ESSCIRC 2018—IEEE Journal of Solid-State Circuits 3208 (November 2018). In one example implementation, the LC oscillator may be disposed on an integrated circuit where each of the inductors of the LC oscillator are realized using a microstrip, wherein the microstrip is configured to span multiple layers of the integrated circuit. In such an embodiment, the inductive microstrips of multiple LC oscillators may be effectively woven or otherwise integrated together. The example embodiments thus increase the Q-factor of the resonator (passive inductive and capacitive components) while preserving space on the integrated circuit.

As a result of the herein described example embodiments and in some examples, the area occupied by a multi-core LC oscillator may be reduced while still maintaining sufficient Q-factor for RF and mm-wave signal generation applications.

Referring now to FIG. 1, an example dual-core oscillator 100 is provided. As depicted in FIG. 1, the example dual-core oscillator 100 includes a first conductive microstrip 102 and a second conductive microstrip 104. The first conductive microstrip 102 electrically connects to a first terminal 110 of a first active component 106 at a first end and a second terminal 116 of a second active component 108 at a second end. Similarly, the second conductive microstrip 104 electrically connects to a first terminal 114 of the second active component 108 at a first end, and electrically connects to a second terminal 112 of the first active component 106 at a second end. As further depicted in FIG. 1, a trace resistor 118 is disposed between the two conductive microstrips, electrically connecting the first conductive microstrip 102 to the second conductive microstrip 104. The trace resistor 118 is placed such that each conductive microstrip 102, 104 is divided essentially in half. The first conductive microstrip 102 is divided into a first inductor portion 120 of the first conductive microstrip 102 on a first side of the trace resistor 118 and a second inductor portion 122 of the first conductive microstrip 102 on a second side of the trace resistor 118. Similarly, the second conductive microstrip 104 is divided into a first inductor portion 124 on a first side of the trace resistor 118 and a second inductor portion 126 on a second side of the trace resistor 118. As further depicted in FIG. 1, a first capacitor 128 is electrically connected in parallel between the first terminal 110 of the first active component 106 and the second terminal 112 of the first active component 106. Similarly, a second capacitor 130 is electrically connected in parallel between the first terminal 114 of the second active component 108 and the second terminal 116 of the second active component 108.

As described above, FIG. 1 depicts an example embodiment of a dual-core oscillator 100. A dual-core oscillator 100 may be any LC oscillating circuit having two active components (e.g., first active component 106, and second active component 108). In some embodiments, the inductive component (e.g., first conductive microstrip 102, second conductive microstrip 104) may electrically connect the plurality of active components. Depending upon the synchronization of the active components, the separate inductive components may be woven or otherwise integrated together, producing electrical coupling between the separate inductive components to essentially form a single inductive component. While depicted as a dual-core oscillator 100, in some embodiments, more than two active components may be coupled in series with more than two conductive microstrips to create a multi-port oscillating circuit.

In some embodiments, utilizing a dual-port inductor (e.g., first conductive microstrip 102, second conductive microstrip 104) enables increasing the diameter of the inductive loop without increasing the inductance. Increasing the diameter of the inductive loop, in some examples, prevents or lessens the proximity effect that can degrade the quality factor and hence increase the phase noise. A multi-port LC oscillating circuit, such as dual-core oscillator 100 may, in some embodiments, enable an oscillator to generate an output signal with lower phase noise over other previous attempts to reduce the area occupied by an LC oscillator, for example, stacked inductors.

As further depicted in FIG. 1, the example dual-core oscillator 100 includes two active components, a first active component 106 and a second active component 108. An active component may be any component that effectively introduces a negative resistance into the LC oscillating circuit in order to counteract the resistances in the passive components of the LC circuit and enable the LC oscillating circuit to continually oscillate. In some embodiments, the active component may be a cross coupled pair, such as that described in FIG. 11.

As further depicted in FIG. 1, in some embodiments, the active component (e.g., first active component 106, second active component 108) may include a pair of terminals, for example, first terminal 110 of the first active component 106 and second terminal 112 of the first active component 106 (similarly, first terminal 114 of the second active component 108 and second terminal 116 of the second active component 108). In some embodiments, the first terminal and the second terminal may be electrically connected to components of the active component having a voltage 180° out of phase. For example, when the voltage at the first terminal is at maximum positive voltage, the voltage at the second terminal is at maximum negative voltage. Further, when the voltage at the first terminal is at maximum negative voltage, the voltage at the second terminal is at maximum positive voltage. In such an embodiment, the terminals will have a voltage difference of 0 simultaneously. As further described with reference to FIG. 7-FIG. 10, synchronization of the terminals from one active component to another in a LC oscillating circuit will enable different oscillation modes. For each oscillation mode a different equivalent inductance and quality factor are associated. The oscillation mode with higher quality factor exhibits better phase noise.

As further depicted in FIG. 1, the dual-core oscillator 100 includes a trace resistor 118. A trace resistor 118 may be any component electrically connecting the first conductive microstrip 102 with the second conductive microstrip 104. In some embodiments, the trace resistor 118 may be a metal or other conductive material disposed between the first conductive microstrip 102 and the second conductive microstrip 104. The trace resistor 118 may be utilized to prevent latching and to suppress undesired modes of oscillation. Various oscillation modes may be observed in a dual-port and/or multi-port oscillator such as dual-core oscillator 100 based on the voltage supplied by the various active components. In some embodiments, the desired mode of oscillation occurs in an instance in which the voltage phase at the first terminal 110 of the first active component 106 is 180° out of phase with the second terminal 116 of the second active component 108, and subsequently, the voltage phase of the second terminal 112 of the first active component 106 is 180° out of sync with the first terminal 114 of the second active component 108. In such an embodiment, the midpoints on each of the conductive microstrips (e.g., first conductive microstrip 102 and second conductive microstrip 104) are at a virtual ground. Thus, connecting the midpoints of the conductive microstrips suppresses the undesired modes of oscillation while having no effect on the desired mode of operation. Example desired and undesired modes of operation are further discussed in relation to FIG. 7-FIG. 10.

As further depicted in FIG. 1, the trace resistor 118 of the dual-core oscillator 100, essentially divides the first conductive microstrip 102 and the second conductive microstrip 104 into two inductors. For example, as depicted in FIG. 1, the first conductive microstrip 102 is divided into a first inductor portion 120 of the first conductive microstrip 102 and a second inductor portion 122 of the first conductive microstrip 102. Similarly, the second conductive microstrip 104 is divided into a first inductor portion 124 of the second conductive microstrip 104 and a second inductor portion 126 of the second conductive microstrip 104.

As further depicted in FIG. 1, the dual-core oscillator 100 includes a first capacitor 128 electrically connected in parallel with the first terminal 110 of the first active component 106 and the second terminal 112 of the first active component 106. As further depicted in FIG. 1, the dual-core oscillator 100 includes a second capacitor 130 electrically connected in parallel with the first terminal 114 of the second active component 108 and the second terminal 116 of the second active component 108. The capacitors may be any capacitive component and may be utilized to tune the dual-core oscillator 100 to the desired frequency.

Figure 2:
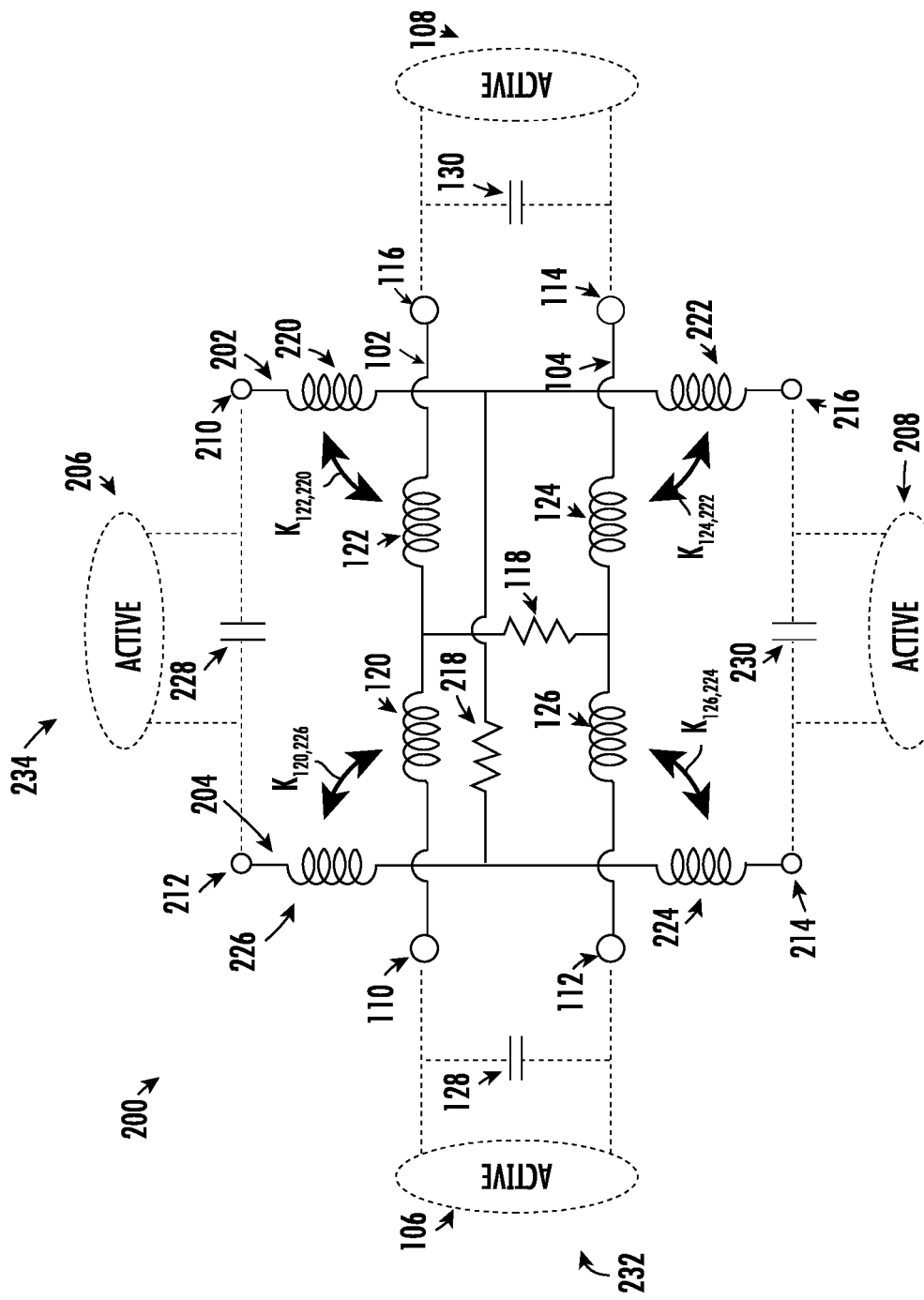
FIG. 2 illustrates a circuit diagram of an example multi-core oscillating device in accordance with an example embodiment of the present disclosure.

Referring now to FIG. 2, a multi-core, inductor coupled LC oscillating circuit 200 is provided. As depicted in FIG. 2, the multi-core, inductor coupled LC oscillating circuit 200 includes a first dual-core oscillator 232 and a second dual-core oscillator 234. Both dual-core oscillators include a first conductive microstrip 102, 202 and a second conductive microstrip 104, 204. The first conductive microstrip 102, 202 electrically connects to a first terminal 110, 210 of a first active component 106, 206 at a first end and a second terminal 116, 216 of a second active component 108, 208 at a second end. Similarly, the second conductive microstrip 104, 204 electrically connects to a first terminal 114, 214 of the second active component 108, 208 at a first end, and electrically connects to a second terminal 112, 212 of the first active component 106, 206 at a second end. As further depicted in FIG. 2, a trace resistor 118, 218 is disposed between the two conductive microstrips of the dual-core oscillator 232, 234, electrically connecting the first conductive microstrip 102, 202 to the second conductive microstrip 104, 204. The trace resistor 118, 218 is placed such that each conductive microstrip 102, 104, 202, 204 is divided essentially in half. The first conductive microstrip 102, 202 is divided into a first inductor portion 120, 220 of the first conductive microstrip 102, 202 on a first side of the trace resistor 118, 218 and a second inductor portion 122, 222 of the first conductive microstrip 102, 202 on a second side of the trace resistor 118, 218. Similarly, the second conductive microstrip 104, 204 is divided into a first inductor portion 124, 224 on a first side of the trace resistor 118, 218 and a second inductor portion 126, 226 on a second side of the trace resistor 118, 218. As further depicted in FIG. 2, a first capacitor 128, 228 is electrically connected in parallel between the first terminal 110, 210 of the first active component 106, 206 and the second terminal 112, 212 of the first active component 106, 206. Similarly, a second capacitor 130, 230 is electrically connected in parallel between the first terminal 114, 214 of the second active component 108, 208 and the second terminal 116, 216 of the second active component 108, 208.

As further depicted in FIG. 2, the second dual-core oscillator 234 is rotated in orientation 90° from the orientation of the first dual-core oscillator 232 and positioned such that the first conductive microstrip 102 and the second conductive microstrip 104 of the first dual-core oscillator 232 intersect with the first conductive microstrip 202 and the second conductive microstrip 204 of the second dual-core oscillator 234. The positioning of the first dual-core oscillator 232 in relation to the second dual-core oscillator 234 positions portions of the first dual-core oscillator 232 in close proximity to portions of the second dual-core oscillator 234, such that the inductor portions experience a magnetic coupling. For example, as shown in FIG. 2, the first inductor portion 120 of the first conductive microstrip 102 of the first dual-core oscillator 232 is in close proximity to the second inductor portion 226 of the second conductive microstrip 204 of the second dual-core oscillator 234 such that a magnetic coupling $k_{120,226}$ exists between the two portions. Similarly, the second inductor portion 122 of the first conductive microstrip 102 of the first dual-core oscillator 232 is positioned in close proximity to the first inductor portion 220 of the first conductive microstrip 202 of the second dual-core oscillator 234 such that a magnetic coupling $k_{122,220}$ exists between the two portions. In addition, the first inductor portion 124 of the second conductive microstrip 104 of the first dual-core oscillator 232 is positioned in close proximity to the second inductor portion 222 of the first conductive microstrip 202 of the second dual-core oscillator 234 such that a magnetic coupling $k_{124,222}$ exists between the two portions. Further, the second inductor portion 126 of the second conductive microstrip 104 of the first dual-core oscillator 232 is positioned in close proximity to the first inductor portion 224 of the second conductive microstrip 204 of the second dual-core oscillator 234 such that a magnetic coupling $k_{126,224}$ exists between the two portions. Each of the magnetic couplings $k_{120,226}$, $k_{122,220}$, $k_{126,224}$, $k_{124,222}$ may be represented by a coupling coefficient. A coupling coefficient quantifies the amount of generated electromagnetic field induced in a secondary inductor due to the electromagnetic field of the first inductor. In general, the coupling coefficient must be sufficiently high to allow for synchronization between the two inductor portions. In some embodiments, the magnitude of the coupling coefficient between two inductors experiencing a magnetic coupling $k_{120,226}$, $k_{122,220}$, $k_{126,224}$, $k_{124,222}$ may be greater than 0.1; more preferably greater than 0.25; most preferably greater than 0.5.

As depicted in FIG. 2, the example multi-core, inductor coupled LC oscillating circuit 200 includes a first dual-core oscillator 232 and a second dual-core oscillator 234 positioned such that portions of the conductive microstrips 102, 104 of the first dual-core oscillator 232 are in close proximity with portions of the conductive microstrips 202, 204 of the second dual-core oscillator 234. While depicted in FIG. 2 as two dual-core oscillators, an example multi-core, inductor coupled LC oscillating circuit 200 may include two-port LC oscillating circuits, three-port LC oscillating circuits, four-port LC oscillating circuits, and/or any combination thereof. Magnetically coupling multiple LC oscillating circuits by synchronizing the oscillation of the individual LC oscillating circuits enables generation of output signals with low phase noise.

Table 1 depicts a comparison of an example embodiment of the present disclosure as compared to the disclosed known solutions of Iotti et al., Rimmelspacher et al., and Murphy et al. across a number of characteristics. While Table 1 depicts two embodiments of the present disclosure having two different sizes (size 1 and size 2), the disclosure is not limited to the depicted sizes. The present disclosure enables a trade-off between the area occupied by an oscillator and the power consumed by the oscillator, while generating a signal with phase noise comparable to or better than previous examples. Table 1 depicts only two such embodiments. The compared characteristics include: the topology of the inductors, the type of the VCO, the underlying process technology, the frequency of oscillation, the tuning range, the phase-noise (PN) at 1 MHz offset, the PN at 1 MHZ offset normalized to 19.125 GHZ, the supply voltage ($V_{dd}$), the current in milli-amps (mA), the power in milli-watts (mW), the area of the inductor in square millimeters (mm$^2$), and the figures of merit (FoM, FoM$_T$, FoM$_A$). The figures of merit are calculated according to Equations (1)-(3):

$$FoM = PN - 20 \cdot \log_{10}\left(\frac{f_0}{\Delta f}\right) + 10 \cdot \log_{10}(P_{DC,mW}) \qquad (1)$$

$$FoM_T = FoM - 20 \cdot \log_{10}\left(\frac{TR}{10}\right) \qquad (2)$$

$$FoM_A = FoM + 10 \cdot \log_{10}(Area_{mm^2}) \qquad (3)$$

where PN is the phase noise, $f_0$ is the oscillation frequency, $\Delta f$ is the offset frequency from the carrier at which the phase noise is measured, $P_{DC,mW}$ is the DC power consumption expressed in milli-watts, TR is the frequency tuning range, and Area$_{mm}^2$ is the area occupation expressed in mm$^2$. The "Example Embodiment: small" represents an example embodiment in accordance with the present disclosure comprising an area of 0.022 mm$^2$. The "Example Embodiment: medium" represents an example embodiment in accordance with the present disclosure comprising a slightly larger area, namely an area of 0.031 mm$^2$.

As depicted in Table 1, the multi-core, inductor coupled LC oscillating circuit 200 in accordance with one or more examples of the current embodiment comprises a number of distinct advantages over other approaches that have been used. For example, in some embodiments the phase-noise at 1 MHz offset normalized to 19.125 GHz of the multi-core, inductor coupled LC oscillating circuit 200 may be less than −110 dBc/Hz; more preferably less than −115 dBc/Hz; most preferably less than −117 dBc/Hz. Thus the phase-noise of the output signal is substantially similar to the best performing previous solutions. In addition, the overlapping portions of the conductive microstrips 102, 104, 202, 204, result in reduced space necessary to implement the example multi-core, inductor coupled LC oscillating circuit 200. In some embodiments, a multi-core, inductor coupled LC oscillating circuit 200 in accordance with one or more examples of the current embodiment may reduce the area required by the multi-core, inductor coupled LC oscillating circuit 200 by between 30% and 50% over previous examples; more preferably between 50% and 80%; most preferably between 80% and 95%. Moreover, the reduction of area can be traded with the power consumption without significantly affecting the overall phase-noise performance.

TABLE 1

Advantages Versus Known Solutions

|  | Iotti et al. | Rimmelspacher et al. | Murphy et al. | Example Embodiment: Size 1 | Example Embodiment: Size 2 |
| --- | --- | --- | --- | --- | --- |
| Topology | Single-turn | Stacked | Four-port | Stacked two-port | Stacked two-port |
| VCO | Class-B, NMOS-only, tail filtering | NMOS-only, tail filtering, push-push | CMOS, 4$f_0$ tail filtering | CMOS | CMOS |
| Technology | BICMOS 55 nm | 45 nm PDSOI CMOS | 40 nm CMOS | 28 nm FDSOI CMOS | 28 nm FDSOI CMOS |
| Frequency (GHz) | 20 | 60.5 | 26.45 | 19.125 | 19.125 |
| Tuning Range | 15% (analog and discrete) | 19% (analog only) | 26% (analog and discrete) | 21% (analog and discrete) | 21% (analog and discrete) |
| PN @ 1 MHz (dBc/Hz) | −118.5 | −101.7 | −109.5 | −118.7 | −117.6 |
| Normalized PN @ 1 MHz from 19.125 GHz | −118.9 | −111.7 | −112.3 | −118.7 | −117.6 |
| $V_{dd}$ (V) | 1.2 | 1 | 0.95 | 1.2 | 1.2 |
| Current (mA) | 36 | 40 | 17 | 27 | 18 |
| Power (mW) | 43 | 40 | 16 | 32 | 22 |
| Area (mm$^2$) | 0.6 | 0.044 | 0.1 | 0.022 | 0.031 |
| FoM (dBc/Hz) | −188.2 | −181.3 | −186.8 | −189.3 | −189.8 |
| FoM$_T$ (dBc/Hz) | −191.7 | −186.9 | −195.0 | −195.7 | −196.2 |
| FoM$_A$ (dBc/Hz) | −190.4 | −194.9 | −196.8 | −205.9 | −204.9 |

Figure 3:
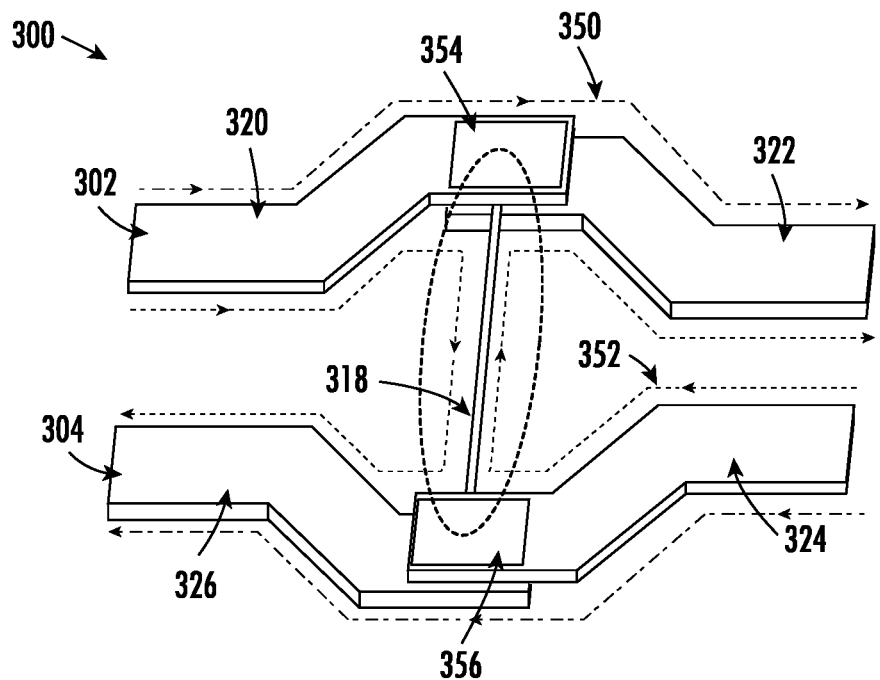
FIG. 3 illustrates a top view of an example implementation of a dual-port inductor having a horizontal orientation in accordance with an example embodiment of the present disclosure.

Referring now to FIG. 3, an example implementation of a dual-port inductor 300 is provided. The example implementation of the dual port oscillator 300 includes a first conductive microstrip 302 spanning two parallel planes, for example, two layers of a multi-layer integrated circuit. The first conductive microstrip includes a first inductor portion 320 of the first conductive microstrip 302 which is positioned on a second plane or layer and a second inductor portion 322 of the first conductive microstrip 302 positioned on a first plane or layer. As depicted in FIG. 3, the first inductor portion 320 of the first conductive microstrip 302 at least partially overlaps with the second inductor portion 322 of the first conductive microstrip 302 creating an overlapping region 354 of the first conductive microstrip 302. In some embodiments, the first inductor portion 320 of the first conductive microstrip 302 and the second inductor portion 322 of the first conductive microstrip 302 are electrically connected at the overlapping region 354 of the first conductive microstrip 302. As further depicted in FIG. 3, a second conductive microstrip 304 is depicted, also spanning two parallel, planes. The depicted second conductive microstrip 304 is substantially symmetric to the first conductive microstrip 302 about an axis parallel to the length of the first conductive microstrip 302. However, the first inductor portion 324 of the second conductive microstrip 304 corresponding with the second inductor portion 322 of the first conductive microstrip 302 is disposed on the second layer. Further, the second inductor portion 326 of the second conductive microstrip 304 is disposed on the first layer and corresponds to the first inductor portion 320 of the first conductive microstrip 302. The second conductive microstrip 304 similarly includes an overlapping region 356 at which the first inductor portion 324 of the second conductive microstrip 304 may be electrically connected with the second inductor portion 326 of the second conductive microstrip 304.

As further depicted in FIG. 3, the dual-port inductor 300 includes a high-resistance trace 318 electrically connecting the overlapping region 354 of the first conductive microstrip 302 with the overlapping region 356 of the second conductive microstrip 304. Also depicted in FIG. 3, are the theoretical currents 352 for the desired oscillation mode, passing through the high-resistance trace 318 and the net currents 350, representing the sum of the theoretical currents, and running one direction in the first conductive microstrip 302 and the opposite direction in the second conductive microstrip 304.

Figure 5:
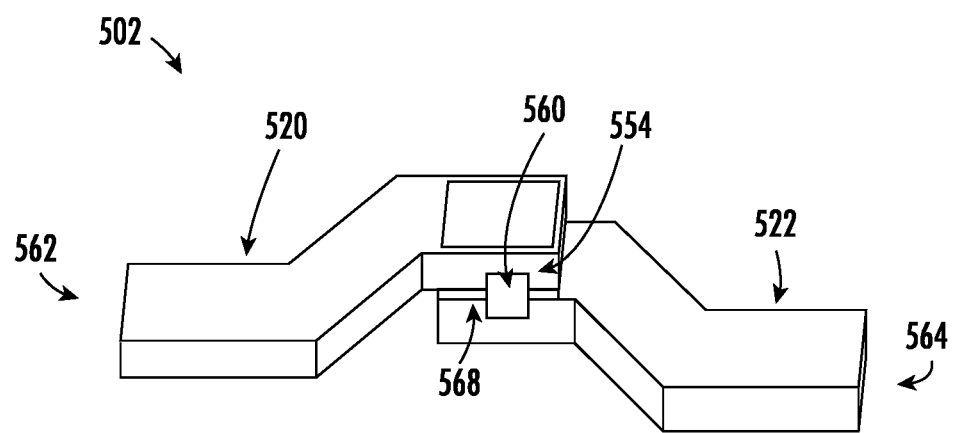
FIG. 5 depicts a side view of an example inductor comprising two microstrips on disparate layers in accordance with an example embodiment of the present disclosure.

As depicted in FIG. 3, the example dual-port inductor 300 includes a first conductive microstrip 302 spanning two layers. The first conductive microstrip 302 may be any conductive material spanning a length and at least a portion (e.g., second inductor portion 322) occupying a first layer and another portion (e.g., first inductor portion 320) occupying a second layer. In some embodiments, the conductive microstrip may comprise conductive materials disposed on the surface of a semiconductor integrated circuit or a printed circuit board (PCB). In some embodiments, the conductive materials may comprise a metal, such as copper, silver, gold, aluminum, etc. In some embodiments, the conductive materials may comprise doped silicon. In some embodiments, the first inductor portion 320 and the second inductor portion 322 of the first conductive microstrip 202 may be disposed on distinct layers of a semiconductor integrated circuit. In some embodiments, the first inductor portion 320 and the second inductor portion 322 of the first conductive microstrip 302 may be electrically connected at a point of contact in the overlapping region 354. For example, the surface of the first inductor portion 320 may directly contact the surface of the second inductor portion 322. In some embodiments, a via, such as connecting via 560 (as shown in FIG. 5) may provide an electrical connection between the portions of the first conductive microstrip.

As depicted in FIG. 3, in some embodiments, the first conductive microstrip 302 may include a semi-circular, hexagonal, octagonal, or other quasi-circular shape. The present disclosure is not limited to any shape or geometry and the conductive microstrips may even be implemented as linear and/or near linear features.

As further depicted in FIG. 3, the example dual-port inductor 300 includes a second conductive microstrip 304. Similar to the first conductive microstrip 302, the second conductive microstrip 304 may be any conductive material spanning a length and at least a portion (e.g., second inductor portion 326) occupying a first layer and another portion (e.g., first inductor portion 324) occupying a second layer. As further depicted, the second conductive microstrip 304 further includes an overlapping region 356 wherein the first inductor portion 324 and the second inductor portion 326 disposed in separate planes, overlap one another.

As depicted in FIG. 3, the second conductive microstrip 304 is substantially symmetric to the first conductive microstrip 302 across an access running substantially parallel to the length of the conductive microstrips, however, the corresponding portions of the second conductive microstrip 304 are on inverted planes. For example, the first inductor portion 324 of the second conductive microstrip 304 is disposed on the second plane while the corresponding second inductor portion 322 of the first conductive microstrip 302 is disposed on the first plane. And, the second inductor portion 326 of the second conductive microstrip 304 is disposed on the first plane while the corresponding first inductor portion 320 of the first conductive microstrip 302 is disposed on the second plane.

Figure 4:
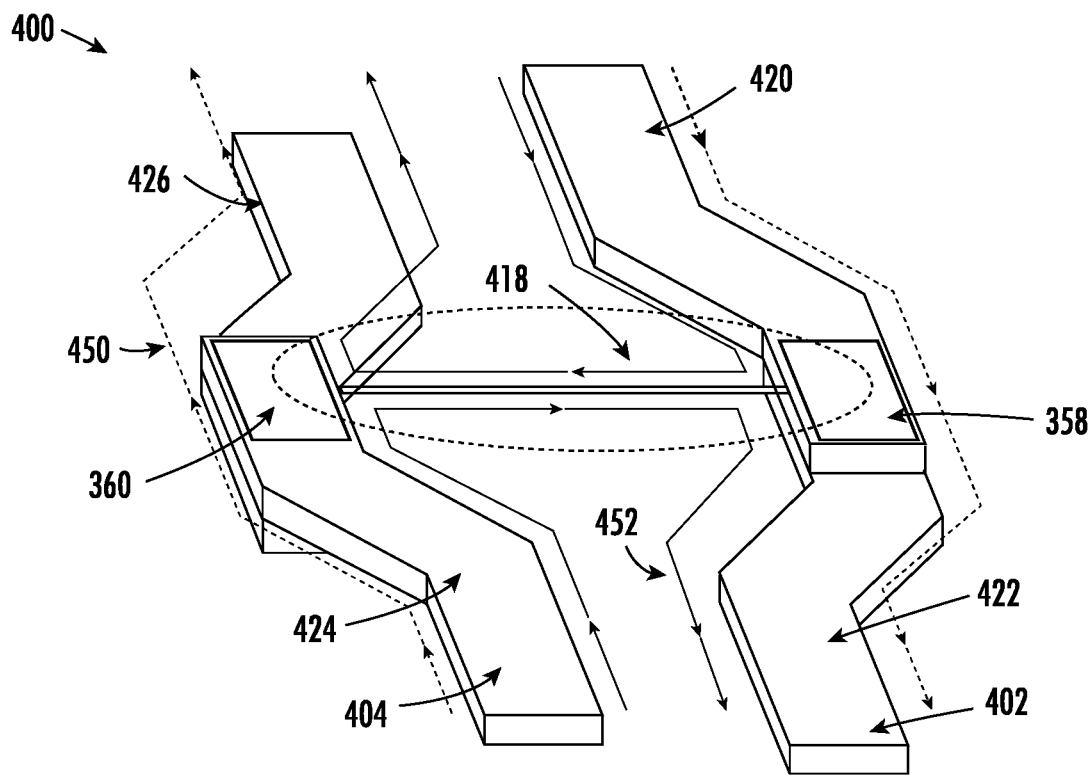
FIG. 4 illustrates a top view of another example dual-port inductor having a vertical orientation in accordance with an example embodiment of the present disclosure.

Referring now to FIG. 4, another example dual-port inductor 400 is shown, otherwise identical to the dual-port inductor of FIG. 3, but rotated at a 90° angle in relation to the example dual-port inductor 300 of FIG. 3. As depicted in FIG. 4, the first inductor portion 420 of the first conductive microstrip 402 is disposed on a second layer, while the second inductor portion 422 of the first conductive microstrip 402 is disposed on a first layer. In addition, as depicted in FIG. 4, the second inductor portion 426 of the second conductive microstrip 404 is disposed on a first layer and is across the symmetrical axis from the first inductor portion 420 of the first conductive microstrip 402 disposed on the second layer. Further, the first inductor portion 424 of the second conductive microstrip 404 is disposed on the second layer and is across the symmetrical axis from the second inductor portion 422 of the first conductive microstrip 402 disposed on the first layer. FIG. 3 further depicts a high-resistance trace 418 electrically connecting the overlapping region 358 of the first conductive microstrip 402 with the overlapping region 360 of the second conductive microstrip 404. In addition, the theoretical currents 452 and net currents 450 passing through the electrical components are shown in FIG. 4.

Referring now to FIG. 5, a side view of an example conductive microstrip 502 spanning two planes, is provided. As depicted in FIG. 5, the example conductive microstrip 502 includes a first inductor portion 520 disposed on a second plane 562 and a second inductor portion 522 disposed on a first plane 564. The first inductor portion 520 and the second inductor portion 522 of the conductive microstrip 502 overlap at an overlapping region 554. Further, a connective via 560 provides an electrical connection between the first inductor portion 520 and the second inductor portion 522 at the overlapping region 554. While the first inductor portion 520 is depicted on the second plane 562 and the second inductor portion 522 on the first plane 564, the portions may be inverted such that, for example, the first inductor portion 520 is disposed on the first plane 564 and the second inductor portion 522 is disposed on the second plane 562.

As depicted in FIG. 5, the example conductive microstrip 502 includes a connecting via 560. The connecting via 560 may be any structure, feature, device, material, or similar means to provide an electrical connection between the first inductor portion 520 of the conductive microstrip 502 disposed on the second plane 562, and the second inductor portion 522 of the conductive microstrip 502 disposed on the first plane 564. In some embodiments, the connective via 560 may be a conductive material contacting both the first inductor portion 520 and the second inductor portion 522. In some embodiments, the connecting via 560 may be formed as part of a photolithographic process after forming the second inductor portion 522, for example, in a semiconductor material and before forming the first inductor portion 520. In some embodiments, an insulating material layer 568 may exist between the second inductor portion 522 and the first inductor portion 520. In such an embodiment, the connecting via 560 may provide an electrical connection through the insulating material layer 568. In some embodiments, the upper surface of the second inductor portion 522 may directly contact the lower surface of the first inductor portion 520 providing a direct contact, in which the connecting via 560 may be unnecessary.

Figure 6:
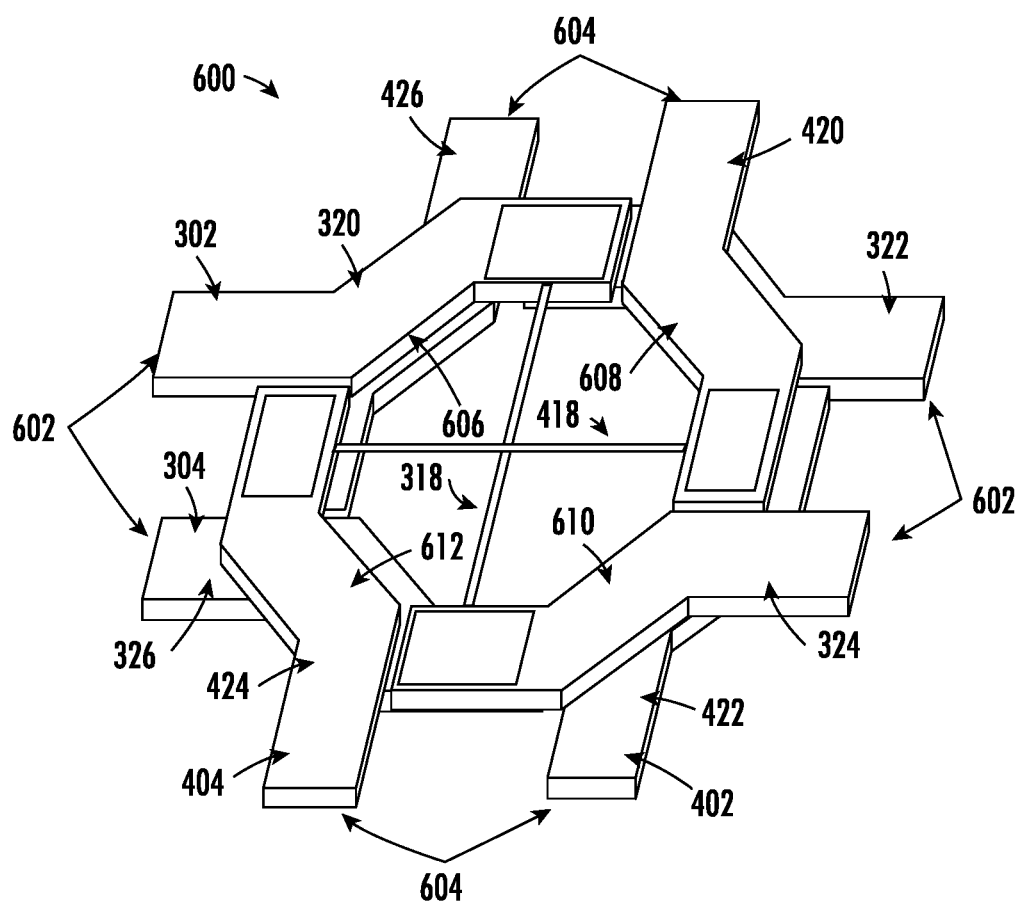
FIG. 6 depicts a top view of an example inductor comprising two dual-port inductors interwoven across two layers in accordance with an example embodiment of the present disclosure.

Referring now to FIG. 6, an overhead view of an example implementation of an inductor portion 600 of a multi-core, inductor coupled LC oscillating circuit is shown. As shown in FIG. 6, the example inductor portion 600 of the multi-core, inductor coupled LC oscillating circuit includes a first dual-port inductor 602 shown in a horizontal configuration (as seen in FIG. 3) and a second dual-port inductor 604 shown in a vertical configuration (as seen in FIG. 4). As shown in FIG. 6, the first dual-port inductor 602 and the second dual-port inductor 604 are disposed in an intersecting pattern. As described in relation to FIG. 3-FIG. 5, each conductive microstrip 302, 304, 402, 404 may span more than one plane, or layer.

As depicted in FIG. 6, the conductive microstrips 302, 304 of the first dual-port inductor are interwoven with the conductive microstrips 402, 404 of the second dual-port conductor. One depicted embodiment of the interwoven conductive micro strips is shown in FIG. 6. As described herein, "front" refers to the portion closest to the overhead perspective view of the example inductor portion 600 of the multi-core, inductor coupled LC oscillating circuit. Similarly, "back" refers to the portion farthest from the overhead perspective view of the example inductor portion 600 of the multi-core, inductor coupled LC oscillating circuit.

From the perspective of the overhead view of FIG. 6, the first inductor portion 320 of the first conductive microstrip 302 of the first dual-port inductor 602 passes in front of the second inductor portion 426 of the second conductive microstrip 404 of the second dual-port inductor 604 and behind the first inductor portion 420 of the first conductive microstrip 402 of the second dual-port inductor 604. As further depicted in FIG. 6, the first inductor portion 324 of the second conductive microstrip 304 of the first dual-port inductor 602 passes in front of the second inductor portion 422 of the first conductive microstrip 402 of the second dual-port inductor 604 and behind the first inductor portion 424 second conductive microstrip 404 of the second dual-port inductor 604.

Thus, each of the conductive microstrips 302, 304, 402, 404 pass in front of one intersecting conductive microstrip 302, 304, 402, 404, and behind another intersecting conductive microstrip 302, 304, 402, 404. At each intersection of conductive microstrips, magnetic coupling may occur. At region 606, the first inductor portion 320 of the first conductive microstrip 302 of the first dual-port inductor 602 is in close proximity with the second inductor portion 426 of the second conductive microstrip 404 of the second dual-port inductor 604, thus, magnetic coupling between the two conductive microstrips may be occurring at magnetic coupling region 606. Similarly, magnetic coupling may occur between the second inductor portion 322 of the first conductive microstrip 302 of the first dual-port inductor 602 and the first inductor portion 420 of the first conductive microstrip 402 of the second dual-port inductor 604 at magnetic coupling region 608. At magnetic coupling region 610, magnetic coupling may occur between the second inductor portion 422 of the first conductive microstrip 402 of the second dual-port inductor 604 and the first inductor portion 324 of the second conductive microstrip 304 of the first dual-port inductor 602. Finally, magnetic coupling may occur at magnetic coupling region 612 between the second inductor portion 326 of the second conductive microstrip 304 of the first dual-port inductor 602 and the first inductor portion 424 of the second conductive microstrip 404 of the second dual-port inductor 604. The strength of magnetic coupling may be dependent on a number of factors, including but not limited to the distance between the conductive microstrips, the cross-sectional area of the conductive microstrips, the direction of the current passing through the conductive microstrips, the orientation of the microstrips, and many other factors. In some embodiments, the coupling coefficient between two inductors experiencing a magnetic coupling in magnetic coupling regions 606, 608, 610, 612 may be greater than 0.1; more preferably greater than 0.25; most preferably greater than 0.5.

As further shown in FIG. 6, in some embodiments and to improve magnetic coupling between the portions of the conductive microstrips 302, 304, 402, 404, the paths of the intersecting conductive microstrips 302, 304, 402, 404 may coincide for a distance. For example, the first inductor portion 320 of the first conductive microstrip 302 of the first dual-port inductor 602 may follow a parallel path to the second inductor portion 426 of the second conductive microstrip 404 of the second dual-port inductor 604 in the magnetic coupling region 606. Intersecting microstrips may similarly follow parallel paths in magnetic coupling region 608, 610, and 612.

Figure 7A:
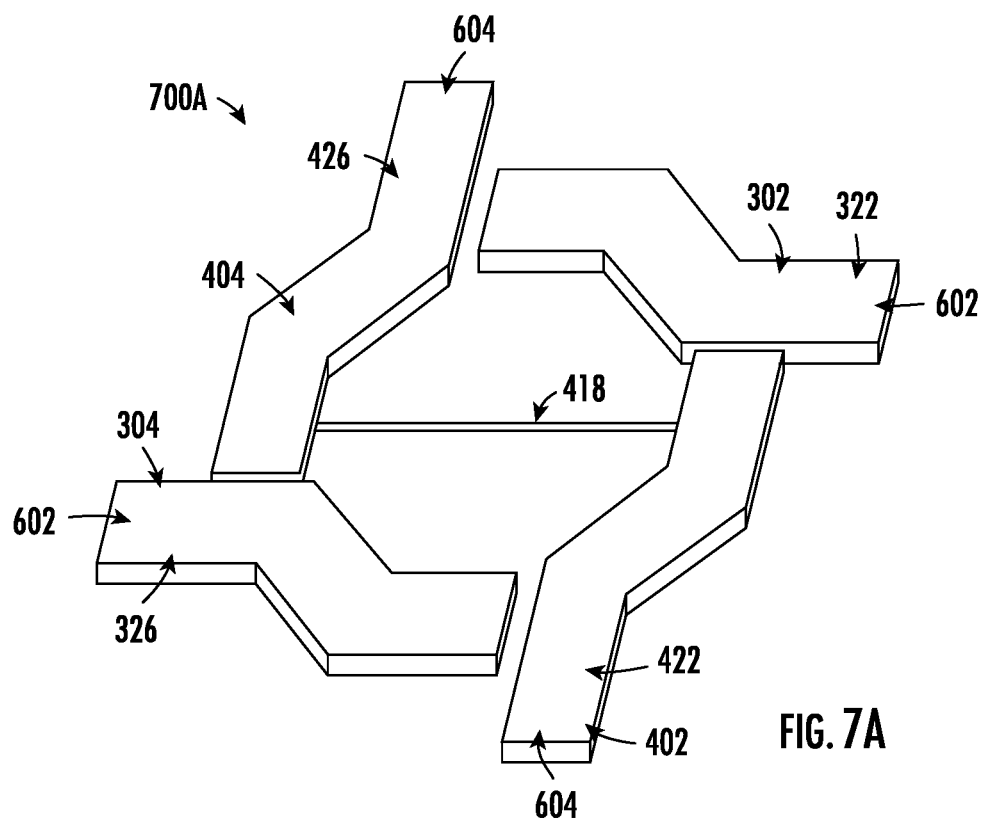
FIG. 7A depicts a perspective view of an example first layer of an example coupled inductor for a multi-core LC oscillating circuit in accordance with an example embodiment of the present disclosure.

Referring now to FIG. 7A, a perspective view of a first layer 700A of an inductor component of a multi-core, inductor coupled LC oscillating circuit (e.g., multi-core inductor coupled LC oscillating circuit 200) is provided. In some embodiments, the first layer 700A may be a bottom or lower layer of a multi-layer semiconductor wafer. The first layer 700A may be disposed on the semiconductor wafer previous to a second layer, such as second layer 700B.

As shown in FIG. 7A, the components disposed on the first layer 700A of the example inductor component of a multi-core, inductor coupled LC oscillating circuit include the second inductor portion 322 of the first conductive microstrip 302 of the first dual-port inductor 602, the second inductor portion 326 of the of the second conductive microstrip 304 of the first dual-port inductor 602, the second inductor portion 422 of the first conductive microstrip 402 of the second dual-port inductor 604, and the second inductor portion 426 of the second conductive microstrip 404 of the second dual-port inductor 604.

Figure 7B:
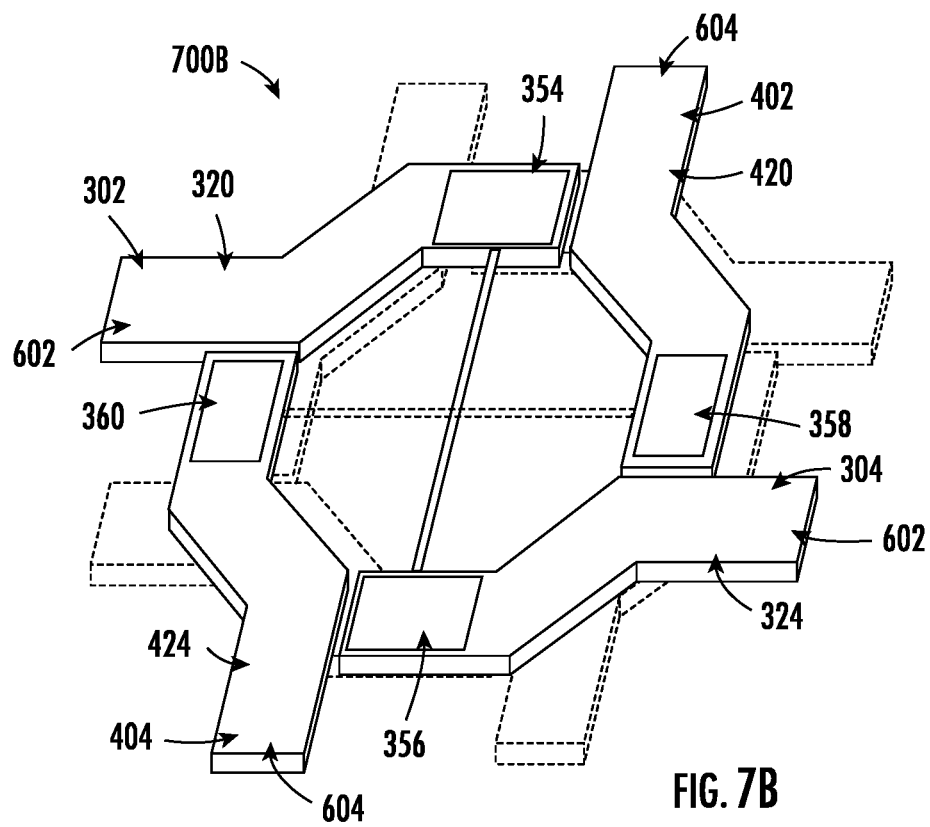
FIG. 7B depicts a perspective view of an example second layer of an example coupled inductor for a multi-core LC oscillating circuit in accordance with an example embodiment of the present disclosure.

Referring now to FIG. 7B, a perspective view of a second layer 700B of an inductor component of an example multi-core, inductor coupled LC oscillating circuit (e.g., multi-core, inductor coupled LC oscillating circuit 200) is provided. In some embodiments, the second layer 700B may be a top or upper layer of a multi-layer semiconductor wafer.

The second layer 700B may be disposed on the semiconductor wafer after a first layer, such as first layer 700A.

As shown in FIG. 7B, the components disposed on the second layer 700B of the example inductor component of a multi-core, inductor coupled LC oscillating circuit include the first inductor portion 320 of the first conductive microstrip 302 of the first dual-port inductor 602, the first inductor portion 324 of the of the second conductive microstrip 304 of the first dual-port inductor 602, the first inductor portion 420 of the first conductive microstrip 402 of the second dual-port inductor 604, and the first inductor portion 424 of the second conductive microstrip 404 of the second dual-port inductor 604.

In some embodiments, the components of the conductive microstrips 302, 304, 402, 404 such as those shown in FIG. 7A and FIG. 7B may be formed by etching the surface of a semiconductor and filling the etched areas with conductive material, by doping targeted regions of the semiconductor material, by etching a conductive material to form a protrusion, by depositing conductive materials on the surface of the semiconductor, or by other similar methods. Portions of the conductive microstrip may be electrically connected at the overlapping regions 354, 356, 358, 360 through direct contact of some sort of connecting via.

Referring now to FIG. 8A-FIG. 8D, example excitation configurations representing different oscillation modes for an example multi-core, inductor coupled LC oscillating circuit (e.g., multi-core, inductor coupled LC oscillating circuit 200) are provided. As depicted in FIG. 8A-FIG. 8D, the two terminals corresponding to a single active component exhibit a voltage difference out of phase by 180°. Thus, when a first terminal exhibits a maximum positive potential difference, the second terminal experiences a maximum negative potential difference. As shown in FIG. 8A-FIG. 8D, an example multi-core, inductor coupled LC oscillating circuit, with an inductor configuration such as the inductor configuration shown in FIG. 6, may include two dual-port inductors, with each inductor electrically connecting to a pair of terminals of an active component at both ends. Thus, in the example embodiment, there are four active components. As depicted in FIG. 8A-FIG. 8D, the arrows represent a subset of the possible excitation modes at each terminal on the example multi-core, inductor coupled LC oscillating circuit. An arrow pointing up represents a 0 degree phase difference with respect to an arbitrary sinusoidal reference and an arrow point down represents a 180 degree phase difference with respect to the aforementioned arbitrary sinusoidal reference. In some embodiments, the excitation sequence may direct the flow of current as to maximize the magnetic coupling and reduce the phase noise of the generated signal.

As depicted in FIG. 8A-FIG. 8D, there are eight terminals providing an electrical connection from the conductive microstrips of the inductive component to an active component: the first terminal of the first active component of the first dual-core oscillator 802; the second terminal of the first active component of the first dual-core oscillator 804; the first terminal of the second active component of the first dual-core oscillator 806; the second terminal of the second active component of the first dual-core oscillator 808; the first terminal of the first active component of the second dual-core oscillator 810; the second terminal of the first active component of the second dual-core oscillator 812; the first terminal of the second active component of the second dual-core oscillator 814; and the second terminal of the second active component of the second dual-core oscillator 816. FIG. 8A At the desired oscillation mode, as shown in FIG. 8A, all currents flow in the same direction through low-resistance conductors 302, 304, 402, 404, such that constructive magnetic coupling occurs between conductive microstrips and boosts the quality factor of the resonator.

FIG. 8B depicts the first undesired oscillation mode in which the current flows from the second terminal of the first active component of the second dual-core oscillator 812 to the first terminal of the second active component of the second dual-core oscillator 814 through low-resistance conductor 404 and from the second terminal of the second active component of the second dual-core oscillator 816 to the first terminal of the first active component of the second dual-core oscillator 810 through low-resistance conductor 402. Thus, the current flowing through the second dual-core oscillator is flowing in the direction opposite the first dual-core oscillator. As such, the magnetic coupling regions where the conductive microstrips intersect, experience destructive magnetic coupling and the quality factor is decreased and thus the phase noise of the output signal is increased.

FIG. 8C depicts the second undesired oscillation mode in which the voltage phase at the second terminal of the first active component of the second dual-core oscillator 812 and the first terminal of the second active component of the second dual-core oscillator 814 is in phase. The depicted oscillation mode creates two primary currents through the second dual-port inductor 604. In some examples, the first current flows from the second terminal of the first active component of the second dual-core oscillator 812 to the first terminal of the first active component of the second dual-core oscillator 810. In such an oscillation mode, current flows through the second inductor portion 426 of the second conductive microstrip 404, through high-resistance trace 418, and through the first inductor portion 420 of the first conductive microstrip 402. The second current flows from the first terminal of the second active component of the second dual-core oscillator 814 to the second terminal of the second active component of the second dual-core oscillator 816. Thus, current flows through the first inductor portion 424 of the second conductive microstrip 404, through high-resistance trace 418, and through the second inductor portion 422 of the first conductive microstrip 402. Since the first current and the second current flow through the high-resistance trace 418, the quality factor associated with the oscillation mode depicted in FIG. 8C is low.

FIG. 8D depicts a third undesired oscillation mode. In addition to the current flow through high-resistance trace 418 due to the oscillation mode of the second dual-port inductor 604, the oscillation mode of the first dual-port inductor 602 creates current flow through the high-resistance trace 318. Since the current flows through the high-resistance trace 318 and the high-resistance trace 418, the quality factor associated with the oscillation mode depicted in FIG. 8D is low. The oscillator will tend to oscillate according to the oscillation mode with the highest quality factor. Since the high-resistance trace 318 and the high-resistance trace 418 reduce the quality factor of the resonator in the undesired modes, the oscillator will tend to oscillate at the desired oscillation mode as depicted in FIG. 8A.

Figure 9:
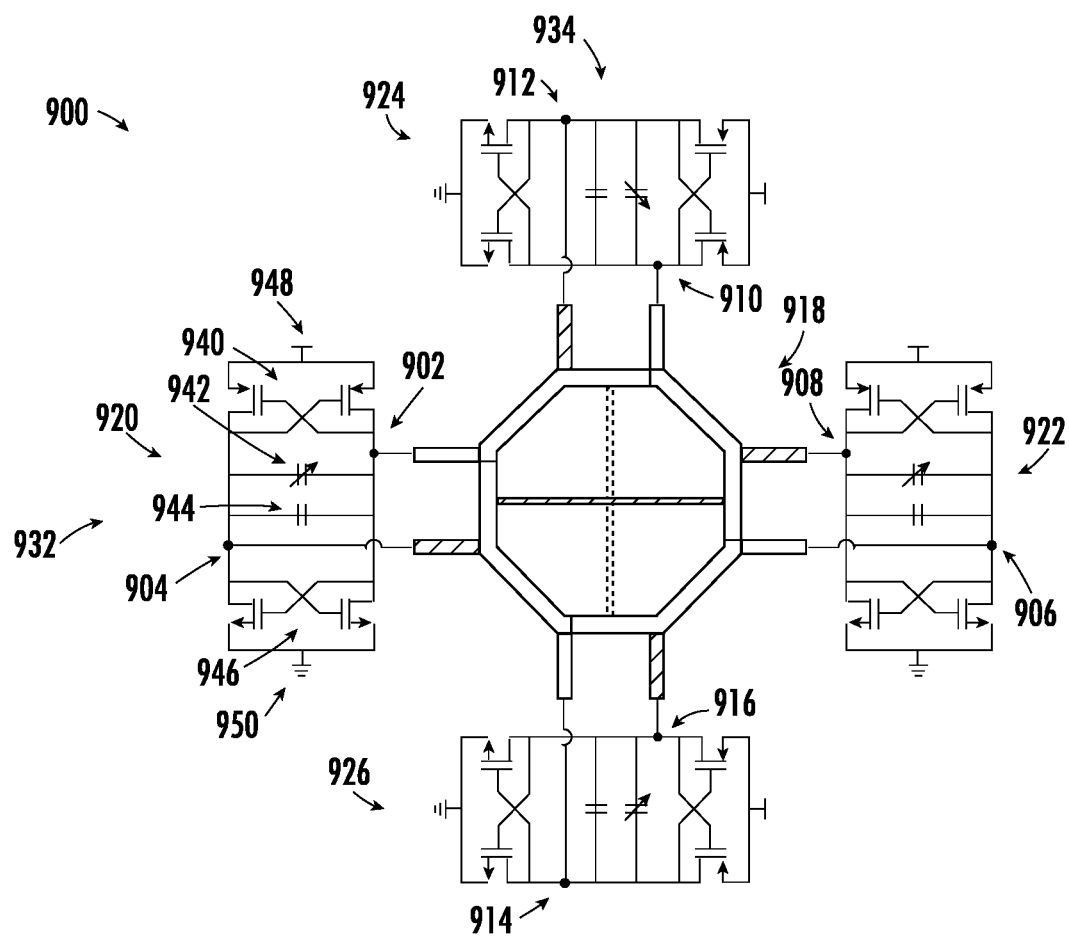
FIG. 9 depicts example active components of an example oscillating circuit comprising two dual-port inductors in accordance with an example embodiment of the present disclosure.

Referring now to FIG. 9, an example implementation of a multi-core, inductor coupled LC oscillating circuit in an example voltage-controlled oscillator (VCO) 900 is provided. In addition to the inductor component 918, the example VCO 900 of FIG. 9 further depicts example active components (e.g., first active component 920 for the first dual-core oscillator 932, second active component 922 for the first dual-core oscillator 932, first active component 924 for the second dual-core oscillator 934, and second active component 926 for the second dual-core oscillator 934) as well as additional elements of a VCO (e.g., varactor 942, capacitor 944). As further depicted in FIG. 9, each of the example active components (e.g., 920, 922, 924, 926) includes a first terminal 902, 906, 910, 914 and a second terminal 904, 908, 912, 916 providing an electrical connection to the inductor component 918 of the example VCO 900. Each example active component 920, 922, 924, 926 is depicted comprising a first cross-coupled transistor pair 940 connected to a voltage source 948, a varactor 942, a capacitor 944, and a second cross-coupled transistor pair 946 connected to a ground 950, all electrically connected in parallel.

As depicted in FIG. 9, the example VCO 900 includes a plurality of active components (e.g., first active component 920 of the first dual-core oscillator 932, second active component 922 of the first dual-core oscillator 932, first active component 924 of the second dual-core oscillator 934, second active component 926 of the second dual-core oscillator 934). An active component may be any device, source, component, structure, or other similar feature that cancels out the effect of the losses within the LC oscillating circuit and sustains the oscillation of the circuit. For example, in some embodiments, the inductive and capacitive components of an LC circuit, as well as the connecting components, may provide resistance to the oscillating current. The resistance of the components may cause degradation in the amplitude of the oscillating current over time. An active component 920, 922, 924, 926 counteracts these and other losses in the LC circuit, allowing the LC circuit oscillation to continue indefinitely.

As further depicted in FIG. 9, the example active components 920, 922, 924, 926 include a first cross-coupled transistor pair 940 and a second cross-coupled transistor pair 946. A cross-coupled transistor pair 940, 946 may be any transistor pair in which gate of each transistor is electrically connected to the drain of the other transistor in the transistor pair. Applying a voltage difference across a cross-coupled transistor pair 940, 946 results in a current flow that mimics a negative resistance, counteracting the resistance in the components of the LC oscillating circuit.

As further depicted in FIG. 9, the example active components 920, 922, 924, 926 include a varactor 942. A varactor 942 may be utilized to tune the output frequency of a VCO 900 output signal. A varactor 942 may exhibit a variable net capacitance based on the voltage applied to the varactor 942. The change in net capacitance exhibited by the varactor 942 causes a tunable variation in the output frequency generated by the VCO 900.

As further shown in FIG. 9, the first terminal 902, 906, 910, 914 of the active component 920, 922, 924, 926 and the second terminal 904, 908, 912, 916 provide an electrical connection to the active component 920, 922, 924, 926. The first terminal and second terminal correspond to a voltage difference out of phase by 180°. For example, when the first terminal is at a maximum positive voltage difference, the second terminal is at a maximum negative voltage difference, and vice versa. Synchronization of the active components 920, 922, 924, 926 enable oscillation modes in which the portions of the inductor component 918 may magnetically couple in a constructive manner.

Figure 10:
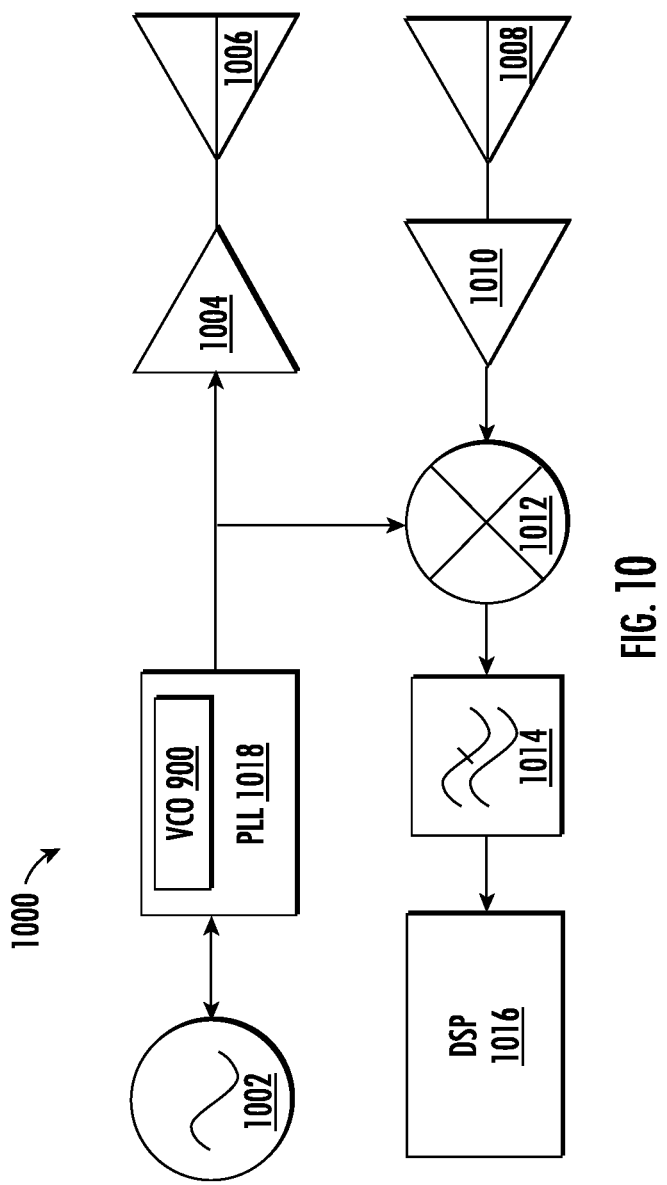
FIG. 10 depicts a system view of a radar system utilizing a voltage-controlled oscillator in accordance with an example embodiment of the present disclosure.

Referring now to FIG. 10, an example radar system 1000 including a VCO 900 in accordance with an example embodiment of the present disclosure is provided. As depicted in FIG. 10, the example radar system 1000 includes a phase-locked loop (PLL) 1018 utilizing a VCO 900 and electrically connected to an oscillator 1002. The PLL 1018 is further electrically connected to a transmit amplifier 1004 on the transmit portion of the radar system 1000 and a mixer 1012 on the receive portion of the radar system 1000. In addition, the transmit amplifier 1004 is electrically connected to a transmit antenna 1006. The receiver portion of the radar system 1000 includes a receive antenna 1008 electrically connected to a low noise amplifier (LNA) 1010 (e.g., receive amplifier), which is subsequently electrically connected to the mixer 1012. On the receiver portion of the radar system 1000, the mixer 1012 is further electrically connected to a low-pass filter 1014 which is in turn electrically connected to a digital signal processor (DSP) 1016.

As depicted in FIG. 10, the example radar system 1000 includes a PLL 1018. A PLL 1018 may, in some embodiments, compare the phase and frequency of the signal generated by a local oscillator (e.g., oscillator 1002) with the phase and frequency of the signal output by the PLL 1018. The PLL 1018 may adjust the output signal by manipulating the input voltage supplied to the VCO 900. The PLL 1018 may be used to generate high-frequency signals based on the output of the VCO 900 that are subsequently amplified by the transmit amplifier 1004 and transmitted via the transmit antenna 1006. In order to improve the resolution and accuracy of the radar system 1000 the high-frequency signal may be generated with low-phase noise.

The radar system 1000 further includes a receive antenna 1008 to receive the reflected signal. The received signal may be amplified using an LNA 1010 and mixed with the signal generated by the PLL 1018 and oscillator 1002. The mixed signal may be filtered with a device such as a low-pass filter 1014 (e.g., receive filter) and analyzed using a DSP 1016 (e.g., processor). In some embodiments, the DSP 1016 may determine characteristics of an object based on a comparison of the reflected signal to the generated signal, as evidenced in the mixed signal. Low-phase noise allows a radar system 1000 receiver to precisely determine changes in the reflected signal, and precisely measure the desired characteristics of the reflecting object. Characteristics may include, the presence and/or movements of objects; the size, shape, and speed of objects; the material make-up of objects; and other similar characteristics.

While this detailed description has set forth some embodiments of the present invention, the appended claims cover other embodiments of the present invention which differ from the described embodiments according to various modifications and improvements. For example, one skilled in the art may recognize that such principles may be applied to any electronic device that generates signals for transmission. For example, any electronic communication device, radar system, satellite system, mobile communication device, or similar electronic system.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A circuit comprising:
  a dual-port inductor comprising:
    a first active component and a second active component, wherein each active component comprises a first terminal and a second terminal;
    a first conductive microstrip comprising a first inductor portion and a second inductor portion electrically connected in series, wherein the first conductive microstrip electrically connects the first terminal of the first active component to the second terminal of the second active component;
    a second conductive microstrip comprising a first inductor portion and a second inductor portion electrically connected in series, wherein the second conductive microstrip electrically connects the second terminal of the first active component to the first terminal of the second active component;
  a coupling inductor comprising:
    a first inductor portion; and
    a second inductor portion,
    wherein the first inductor portion, and the second inductor portion are electrically connected in series;
  wherein the first inductor portion is magnetically coupled to the first or second inductor portion of the first conductive microstrip of the dual-port inductor, and the second inductor portion is magnetically coupled to the first or second inductor portion of the second conductive microstrip of the dual-port inductor, and
  wherein the dual-port inductor and the coupling inductor are different inductors.

2. The circuit of claim 1, wherein the coupling inductor is a multi-port inductor.

3. The circuit of claim 1, wherein the dual-port inductor further comprises a resistor electrically connected between the first conductive microstrip and the second conductive microstrip.

4. The circuit of claim 1, wherein each active component of the dual-port inductor further comprises a capacitive component electrically connected to the first terminal and the second terminal.

5. The circuit of claim 1, wherein a first voltage phase at the first terminal of each active component of the dual-port inductor and a second voltage phase at the second terminal of each active component of the dual-port inductor are inverse.

6. The circuit of claim 1, wherein each active component comprises at least a cross-coupled pair of transistors.

7. The circuit of claim 1, wherein a first coupling coefficient between the first inductor portion of the coupling inductor and the first or second inductor portion of the first conductive microstrip of the dual-port inductor is greater than 0.1, and
  wherein a second coupling coefficient between the second inductor portion of the coupling inductor and the first or second inductor portion of the second conductive microstrip of the dual-port inductor is greater than 0.1.

8. An integrated circuit comprising:
  a first layer;
  a second layer;
  a first dual-port oscillator comprising:
    a first conductive microstrip and a second conductive microstrip,
    wherein each conductive microstrip of the first dual-port oscillator comprises a first end that terminates at a first active component, and a second end that terminates at a second active component,
    wherein each conductive microstrip of the first dual-port oscillator comprises at least a first inductor portion disposed on the first layer and a second inductor portion disposed on the second layer, and
    wherein the first inductor portion and second inductor portion of the first dual-port oscillator are electrically connected by a first connecting via; and
  a second dual-port oscillator comprising:
    a first conductive microstrip and a second conductive microstrip,
    wherein each conductive microstrip of the second dual-port oscillator comprises a first end that terminates at a first active component, and a second end that terminates at a second active component,
    wherein each conductive microstrip of the second dual-port oscillator comprises at least a first inductor portion disposed on the first layer and a second inductor portion disposed on the second layer, and
    wherein the first inductor portion and second inductor portion of the second dual-port oscillator are electrically connected by a second connecting via;
  wherein the first dual-port oscillator and second dual-port oscillator are disposed, such that a portion of the first conductive microstrip of the first dual-port oscillator is substantially aligned with a portion of the first conductive microstrip of the second dual-port oscillator.

9. The integrated circuit of claim 8, wherein at least one second inductor portion of a conductive microstrip of the first dual-port oscillator passes across at least one first inductor portion of a conductive microstrip of the second dual-port oscillator.

10. The integrated circuit of claim 9, wherein the first conductive microstrip of the first dual-port oscillator and the second conductive microstrip of the first dual-port oscillator are electrically connected by a first resistive trace, and wherein the first conductive microstrip of the second dual-port oscillator and the second conductive microstrip of the second dual-port oscillator are electrically connected by a second resistive trace.

11. The integrated circuit of claim 8, wherein each active component comprises at least a cross-coupled pair of transistors and a capacitor.

12. The integrated circuit of claim 8, wherein a portion of the first inductor conductive microstrip and a portion of the second inductor conductive microstrip are magnetically coupled.

13. The integrated circuit of claim 12, wherein a coupling coefficient between the portion of the first inductor conductive microstrip and the portion of the second inductor conductive microstrip is greater than 0.1.

14. A radar system comprising:
  an oscillating system comprising:
    a dual-port inductor comprising:
      a first active component and a second active component, wherein each active component comprises a first terminal and a second terminal;
      a first conductive microstrip comprising a first inductor portion and a second inductor portion electrically connected in series, wherein the first conductive microstrip electrically connects the first terminal of the first active component to the second terminal of the second active component;

a second conductive microstrip comprising a first inductor portion and a second inductor portion electrically connected in series, wherein the second conductive microstrip electrically connects the second terminal of the first active component to the first terminal of the second active component;

a coupling inductor comprising:
  a first inductor portion; and
  a second inductor portion,
  wherein the first inductor portion, and the second inductor portion are electrically connected in series;
wherein the first inductor portion is magnetically coupled to the first or second inductor portion of the first conductive microstrip of the dual-port inductor, and the second inductor portion is magnetically coupled to the first or second inductor portion of the second conductive microstrip of the dual-port inductor, and
wherein the dual-port inductor and the coupling inductor are different inductors.

15. The radar system of claim 14, further comprising:
a voltage-controlled oscillator comprising the oscillating system;
a phase-locked loop comprising the voltage-controlled oscillator,
a local oscillator electrically connected to the phase-locked loop,
  wherein the phase-locked loop generates an output signal based at least in part on a reference signal generated by the local oscillator;

a transmit amplifier electrically connected to the phase-locked loop, wherein the transmit amplifier generates an amplified output signal based at least in part on the output signal;
a transmit antenna electrically connected to the transmit amplifier, wherein the transmit antenna transmits a transmitted signal based at least in part on the amplified output signal;
a receive antenna configured to receive a reflected signal resulting from one or more objects encountered by the transmitted signal;
a receive amplifier electrically connected to the receive antenna, wherein the receive amplifier is configured to generate an amplified receive signal based at least in part on the reflected signal;
a mixer electrically connected to the phase-locked loop and the receive amplifier, wherein the mixer is configured to produce a mixed signal based at least in part on the output signal and the amplified receive signal;
a receive filter electrically connected to the mixer, wherein the receive filter is configured to generate a filtered signal based at least in part on the mixed signal; and
a processor electrically connected to the receive filter, wherein the processor determines one or more characteristics of the one or more objects based at least in part on the filtered signal.

16. The radar system of claim 14, wherein the coupling inductor is a multi-port inductor.

17. The radar system of claim 14, wherein the dual-port inductor further comprises a resistor electrically connected between the first conductive microstrip and the second conductive microstrip.

* * * * *